(12) United States Patent
Cegnar

(10) Patent No.: US 7,471,068 B2
(45) Date of Patent: Dec. 30, 2008

(54) ULTRA-FAST ULTRACAPACITOR CHARGING METHOD AND CHARGER

(75) Inventor: Erik J. Cegnar, Moscow, ID (US)

(73) Assignee: Ivus Industries, LLC, Moscow, ID (US)

( * ) Notice: Subject to any disclaimer, the term of this patent is extended or adjusted under 35 U.S.C. 154(b) by 244 days.

(21) Appl. No.: 11/556,597

(22) Filed: Nov. 3, 2006

(65) Prior Publication Data
US 2008/0106239 A1  May 8, 2008

(51) Int. Cl.
*H01M 10/44* (2006.01)
*H01M 10/46* (2006.01)

(52) U.S. Cl. .................................... 320/167

(58) Field of Classification Search .............. 320/107, 320/116, 117, 120, 122, 166, 167
See application file for complete search history.

(56) References Cited

U.S. PATENT DOCUMENTS

| | | |
|---|---|---|
| 5,714,864 A | 2/1998 | Rose et al. |
| 6,011,379 A | 1/2000 | Singh et al. |
| 6,066,936 A | 5/2000 | Okamura et al. |
| 6,104,169 A | 8/2000 | Radys et al. |
| 6,265,851 B1 | 7/2001 | Brien et al. |
| 6,281,660 B1 | 8/2001 | Abe |
| 6,591,758 B2 | 7/2003 | Kumar |
| 6,612,246 B2 | 9/2003 | Kumar |
| 6,639,381 B2 | 10/2003 | Tamura et al. |
| 6,664,766 B2 | 12/2003 | Desprez et al. |
| 6,836,098 B1 | 12/2004 | O'Brien |
| 6,847,192 B2 | 1/2005 | Turner et al. |
| 7,015,674 B2 | 3/2006 | VonderHaar |
| 7,019,492 B1 | 3/2006 | Baker et al. |
| 7,042,197 B2 | 5/2006 | Turner et al. |
| 2002/0174798 A1 | 11/2002 | Kumar |
| 2002/0177929 A1 | 11/2002 | Kumar |
| 2003/0062876 A1 | 4/2003 | Desprez et al. |
| 2003/0080712 A1 | 5/2003 | Tamura et al. |
| 2003/0184258 A1 | 10/2003 | Vonderhaar |
| 2003/0197487 A1 | 10/2003 | Tamura et al. |
| 2004/0251880 A1 | 12/2004 | O'Brien |
| 2004/0263127 A1 | 12/2004 | Turner et al. |

*Primary Examiner*—Edward Tso
(74) *Attorney, Agent, or Firm*—Stephen M. Nipper; Dykas, Shaver & Nipper, LLP

(57) ABSTRACT

A charger for ultracapacitors that allows many ultracapacitors, that may be connected in several different configurations, to be charged from a very low voltage to their rated voltage very rapidly without cell damage. The charger also allows for the detection of failed cells.

20 Claims, 5 Drawing Sheets

ULTRA-FAST ULTRACAPACITOR CHARGING METHOD AND CHARGER

FIELD OF THE INVENTION

The present invention generally relates to ultracapacitors, and more particularly to chargers for ultracapacitors.

BACKGROUND OF THE INVENTION

Ultracapacitors, also known as double layer capacitors, DLCs, supercapacitors or psuedocapacitors are devices that store electrical energy. Ultracapacitor are increasingly being used to power consumer products, automotive energy storage systems, military applications, etc. as the sole energy storage device or they in combination with batteries.

After their charge is depleted, ultracapacitors are recharged. Ultracapacitors have to go through a fairly large voltage swing to be used as an energy storage device and must be charged carefully to prevent damage. Because ultracapacitors are sensitive to being charged over their rated voltage, overcharging can result in significantly reduced life or failure.

Another issue in recharging ultracapacitors is in capacitance variance. The capacitance of an ultracapacitor will vary from its rated value, usually by no more than ±20%. Therefore, a series connected string of ultracapacitors will likely have cells with different capacitances. When a series connected string is charged, the voltages of the cells will become different from one another because cells with smaller capacitances will charge more rapidly than cells with larger capacitances. This is apparent from Equation 1 (below) which relates the current, voltage, and capacitance of an ideal capacitor.

$$i_c(t) = C \frac{dV_c}{dt} \quad (1)$$

Charged ultracapacitors also experience leakage or self-discharge. This is where energy is internally dissipated thereby reducing the ultracapacitor's voltage. All ultracapacitors do not self-discharge at the same rate. Due to capacitance tolerances and varying leakage, series connected ultracapacitors will often have voltages different from one another.

Current ultracapacitor charging technology uses balancing circuits to try to make every cell in an ultracapacitor array have equal voltage while the ultracapacitor cells are being charged by a power source. In other words, the current method "balances" t he cells. This is done or could be done in five ways.

First, an active circuit is placed over two series connected cells. The circuit compares the voltage of the two cells and then dissipates the energy in the cell that has the highest voltage. Another balancing circuit is then used to balance one of those two cells with the next cell in the series string. Circuits can be connected in this way to balance many series connected cells. This type of balancing has the following limitations: (1) because it takes time to balance all of the cells, the charging cannot be done rapidly ... rapid charging of the cells would not allow enough time to ensure proper balancing and some cells in a series string could become over charged; and (2) balancing circuits consume energy and reduce the voltage of every cell to the lowest voltage cell, which wastes energy.

Second, an active bypass circuit is placed over each cell that dissipates energy from the cell through a resistor when the cell gets close to its maximum rating. However, if the cells are charged at a current rate that is higher than what the circuit can bypass, the cell could become overcharged.

Third, a zener diode having a breakdown voltage close to the rated voltage of the ultracapacitor cell is placed over each cell in a series string. When the cell becomes close to its rated voltage the zener starts to conduct current. This has the same problem as the active bypass circuit of the second way (above). It can only protect the cell if it can bypass as much current as the cell is being charged by. This also wastes energy close to the cells rated voltage because a zener does not have a distinct breakdown voltage.

Fourth, a passive resistor with a small resistive tolerance is placed over each cell. This causes a current to flow, which is significantly higher than the cells leakage current. The higher voltage cells dissipate more energy because more current is drawn through the resistor. Ohm's law, I=V/R, shows why this is true. This method consumes a significant amount of energy from the ultracapacitors and balances the cells very slowly. This slow balancing does not allow the cells to be charged from a low voltage to their maximum voltage rapidly without possibly overcharging one or more of the cells.

Fifth, combinations of the above methods.

The prior art is replete with examples employing such methods. For instance, U.S. Pat. No. 6,664,766 shows a supercapacitor balancing system and method (balancing); U.S. Pat. No. 6,265,851 shows an ultracapacitor power supply for an electric vehicle (bypass); U.S. Pat. No. 6,836,098 shows a battery charging method using supercapacitors at two stages; U.S. Pat. No. 7,042,187 shows a control circuit; and U.S. Pat. No. 6,847,192 shows a power supply for an electrical load.

DESCRIPTION OF THE PREFERRED EMBODIMENTS

Figure 1A:
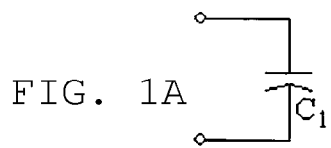
FIG. 1A is a schematic view of a first ultracapacitor configuration that can be charged by the present invention.
Figure 1B:
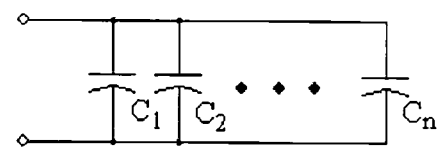
FIG. 1B is a schematic view of a second ultracapacitor configuration that can be charged by the present invention.
Figure 1C:
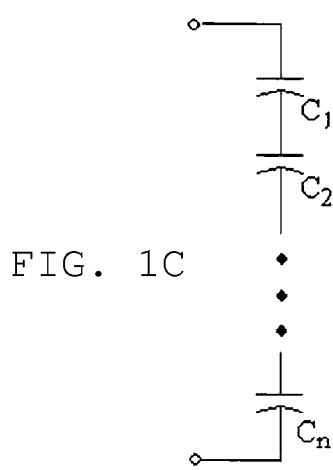
FIG. 1C is a schematic view of a third ultracapacitor configuration that can be charged by the present invention.
Figure 1D:
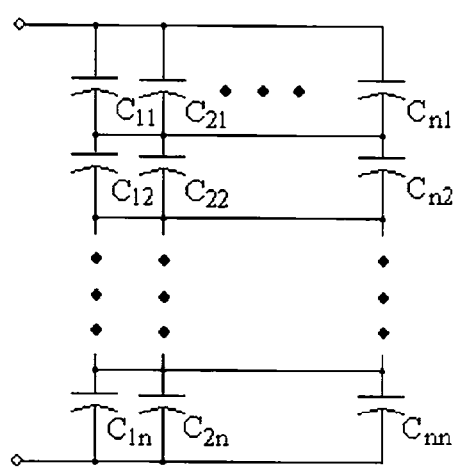
FIG. 1D is a schematic view of a fourth ultracapacitor configuration that can be charged by one or more embodiments of the present invention.

While the invention is susceptible of various modifications and alternative constructions, certain illustrated embodiments thereof have been shown in the drawings and will be described below in detail. It should be understood, however, that there is no intention to limit the invention to the specific form disclosed, but, on the contrary, the invention is to cover all modifications, alternative constructions, and equivalents falling within the spirit and scope of the invention as defined in the claims.

In the following description and in the figures, like elements are identified with like reference numerals. The use of "or" indicates a non-exclusive alternative without limitation unless otherwise noted. The use of "including" means "including, but not limited to," unless otherwise noted.

The present invention is an ultra-fast ultracapacitor pack/device charger (hereinafter "charger"). The charger allows many ultracapacitors that may be connected in several different configurations to be charged from a voltage as low as zero volts to their rated voltage very rapidly without cell damage. Ultracapacitor cells typically fail by a significant increase in effective series resistance (ESR), this cell damage can occur in various ways including: (1) when one or more of the cells becomes charged past the rated voltage of the cell as specified by the manufacturer, as well as (2) through physical damage (damage due to dropping, impact, etc.) to the cell. Cell damage can be defined as when the ultracapacitor cells characteristics are outside of what is identified by the manufacturer. Embodiments of the present invention also allow for the detection of failed cells. This technology allows ultracapacitors to be used in many applications such as rechargeable consumer products, automotive energy storage systems, military applications, etc.

There are many different embodiments of the present invention. The term "charger" used herein to represent generally the present invention and as such mention of one "charger" having a certain element is not intended to be a limitation that all "charger" embodiments have said element unless indicated otherwise.

One embodiment of the present invention's charger allows one or more ultracapacitors to be charged from a totally depleted state to a fully charged state very rapidly (<15 seconds/kilojoule) without overcharging any of the cells, and is particularly useful for charging any type of capacitor with a capacitance greater than ½ Wh/l. This charger embodiment can charge ultracapacitors that are in series, in parallel or combinations of series and parallel. FIGS. 1A-1D show some of the possible ultracapacitor configurations that can be charged by this embodiment of the charger. Further, "string of ultracapacitor cells" is intended to mean "an individual ultracapacitor cell and/or a plurality of interconnected ultracapacitor cells."

While it is preferred that the charger be physically separate from the ultracapacitors (except for the necessary electrical connections), the charger may be integrated directly into the ultracapacitor device if desired.

In one embodiment, the charger consists of a power electronic DC-DC converter that converts an automotive 12-volt power source to a lower voltage and regulates the current to charge the ultracapacitor cells. Other power sources and voltages can be used to power the charger.

Figure 2:
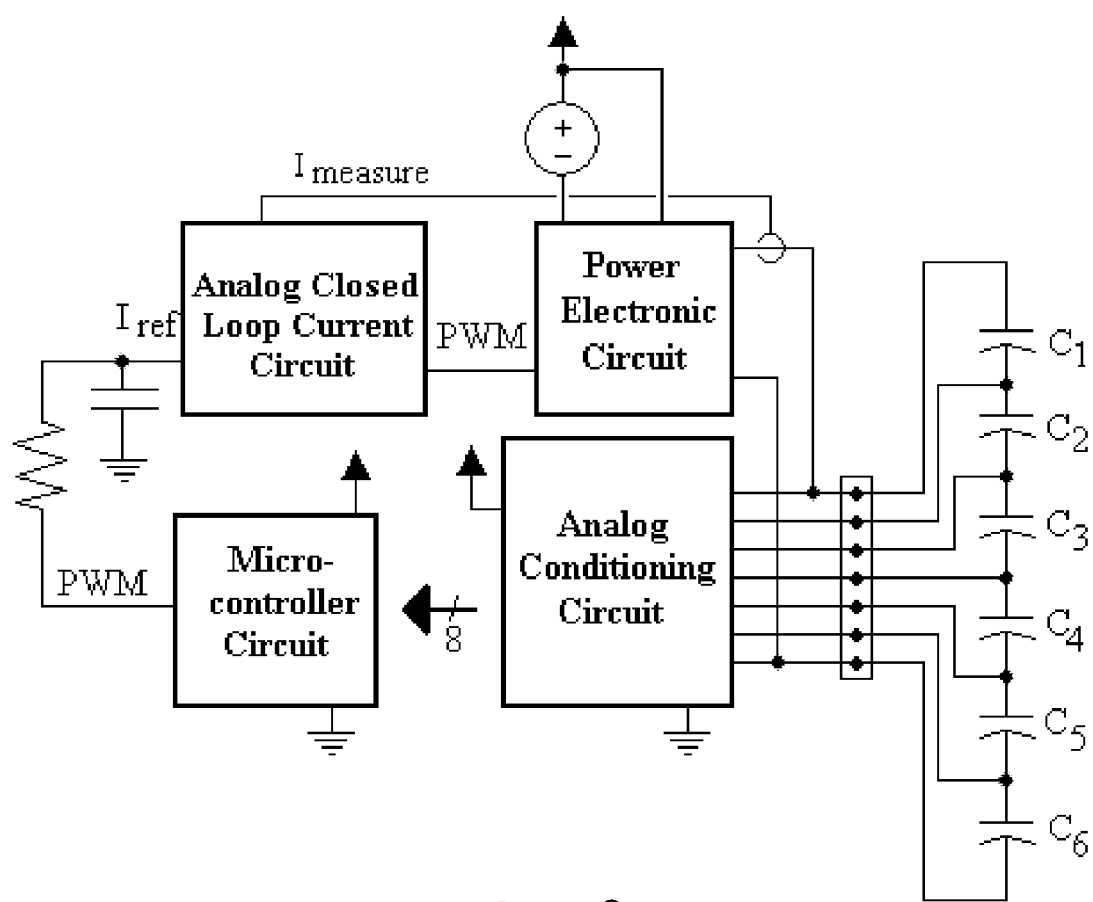
FIG. 2 is system block diagram for one embodiment of the present invention.

In the embodiment of FIG. 2, the charger is composed of a microcontroller/microprocessor (hereinafter "MCU"), a power electronic circuit, analog closed loop current circuit, and an analog conditioning circuit that allows the MCU to measure each voltage of one or more ultracapacitor cells connected in series.

The analog closed loop current circuit regulates the current into the ultracapacitor cells that was commanded by the MCU. The closed loop control is accomplished by measuring the feedback current from the DC-DC converter and comparing it to the commanded current (Iref) and then outputting a pulse-width-modulated (PWM) signal to the DC-DC converter. Other power electronic converter topologies could be used.

The MCU measures the voltage of each ultracapacitor cell in a series string via the analog conditioning circuit. Based on these voltages, the MCU commands a current to the DC-DC converter. This current is commanded using a PWM signal that is filtered with a low-pass filter to a nearly constant voltage signal. This voltage is called Iref (shown in FIG. 2).

The MCU calculates total string voltage by summing all of the ultracapacitor cell voltages. A current (charging) profile is then followed based on the total string voltage and/or individual voltage. This maintains a safe maximum current for the power electronic converter while the ultracapacitor cells charge from a voltage as low as zero to their maximum. The MCU also measures the voltage of the source to ensure it is within a specified range.

The MCU measures the voltage of each ultracapacitor cell during charging and determines the cell with the largest voltage. When the cell with the largest voltage reaches its maximum value, the MCU commands the DC-DC converter to stop charging. This prevents any of the cells from becoming charged beyond their maximum voltage while also allowing them to be charged from a totally depleted state to a totally charged state quickly.

Figure 3:
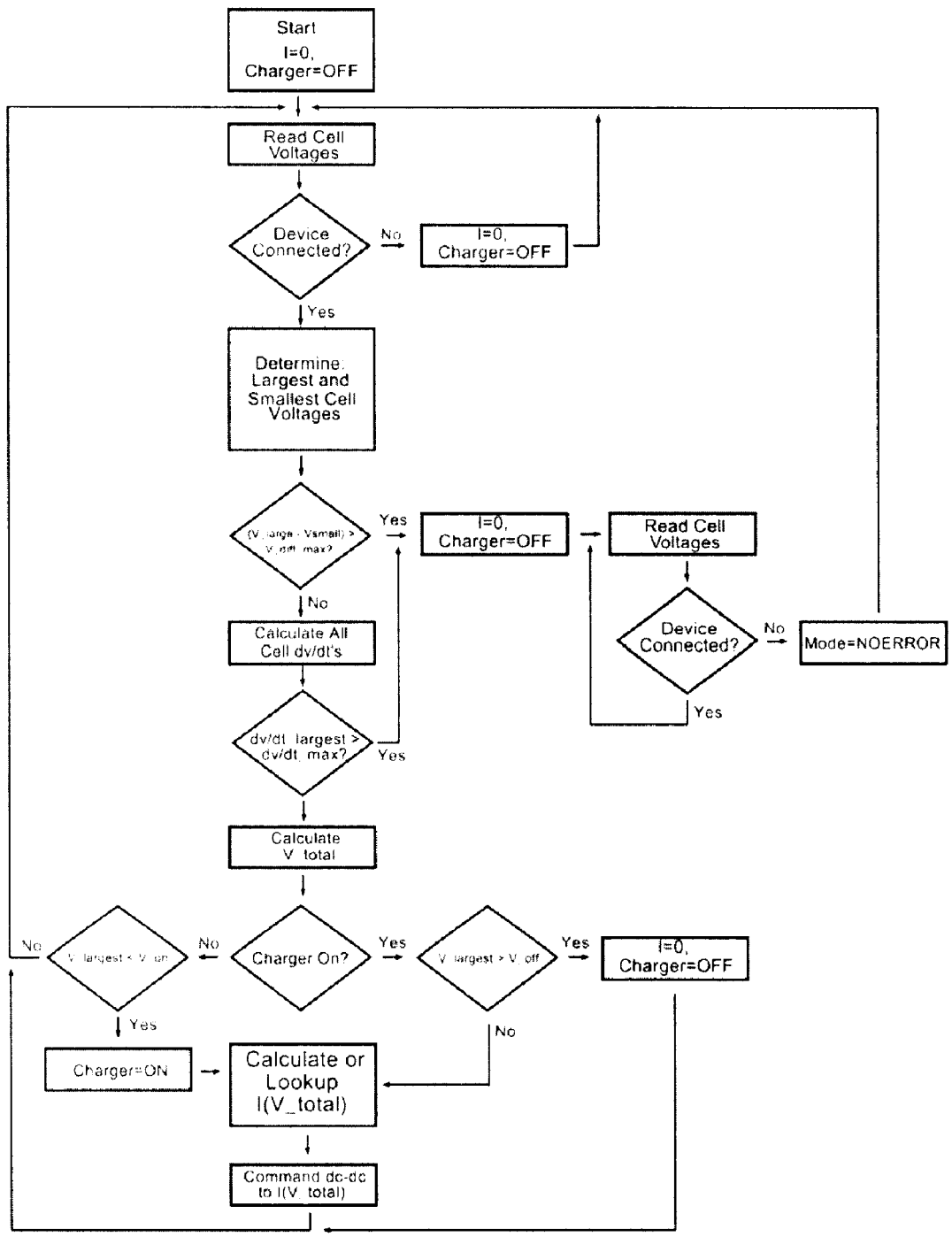
FIG. 3 is a flow chart illustrating the MCU charging program of one embodiment of the present invention.

The charger uses a hysteresis type scheme to prevent the converter from oscillating on and off while at the completely charged state (not shown in FIG. 3). FIG. 3 is a flow chart illustrating the MCU charging program. FIG. 3 excludes, for simplicity, a number of steps, including but not limited to, the user LED indicator control, and the process of preventing operation due to the source voltage not being within a specified range.

The MCU also performs several other tasks. It measures the supply voltage to ensure it is within a specified range and prevents operation if it is not. It operates two light emitting diodes (LED) that indicate if the charger is on, if there is an error, if ultracapacitors are connected, if it is charging, and if the ultracapacitors are fully charged. Additionally, the MCU enables or disables the DC-DC converter.

Ultracapacitor cells typically fail by either a significant increase in effective series resistance (ESR) or by significant decrease in capacitance. The MCU can determine either type of cell failure because it closely monitors cell voltage. The MCU measures the voltage and knows the current for every cell. Therefore, it can determine when one of the cells has failed because it will have a significantly higher voltage while it is being charged.

An analog conditioning circuit is interfaced between the series connected ultracapacitor cells and the MCU's analog-digital-converter (ADC). The analog conditioning circuit consists of several op-amp circuits that measure the difference between the positive terminal and negative terminal of an ultracapacitor cell and outputs a signal proportional to this voltage. The output is a signal that is relative to ground. The analog conditioning circuit also employs a low-pass filter to filter out higher frequencies.

The analog conditioning circuit is scalable and the output can be multiplexed to accompany many ultracapacitor cells. The current embodiment (shown in FIG. 2) measures six series connected cells. The voltage measurements are multiplexed by the microcontroller. Because the analog conditioning circuit is designed to be scalable the overall charger design is scalable to accommodate many cells.

In one embodiment of the present invention, (1) the charger measures the voltage over every cell; (2) the charger's microcontroller detects problems with ultracapacitor arrays, calculates maximum cell voltages, determines total pack voltage, and controls a power electronic converter; (3) the microcontroller allows the current from the power electronic converter to follow a profile (this minimizes charge time and operates the converter safely); (4) items 1-3 above enable the charger to safely charge ultracapacitor arrays very quickly; (5) because the microcontroller monitors the voltage over each cell and the current going through them, it can determine a cell failure; (6) the design is scalable to accommodate many ultracapacitor cells and configurations; and (7) the charger is designed to be as small as possible to allow for integration into products using ultracapacitors.

The embodiment of FIG. 2 uses a DC-DC converter that receives a current command from the MCU to regulate the current into the ultracapacitors. One possible variation of the design is to use a switched resistive network to control current into the ultracapacitors from a DC voltage source. The DC voltage source could be one of the following: (1) a battery; (2) an AC to DC converter; and/or (3) a DC to DC converter. In cases (2) and (3) these provide an internal control scheme that regulates the output voltage.

Figure 4:
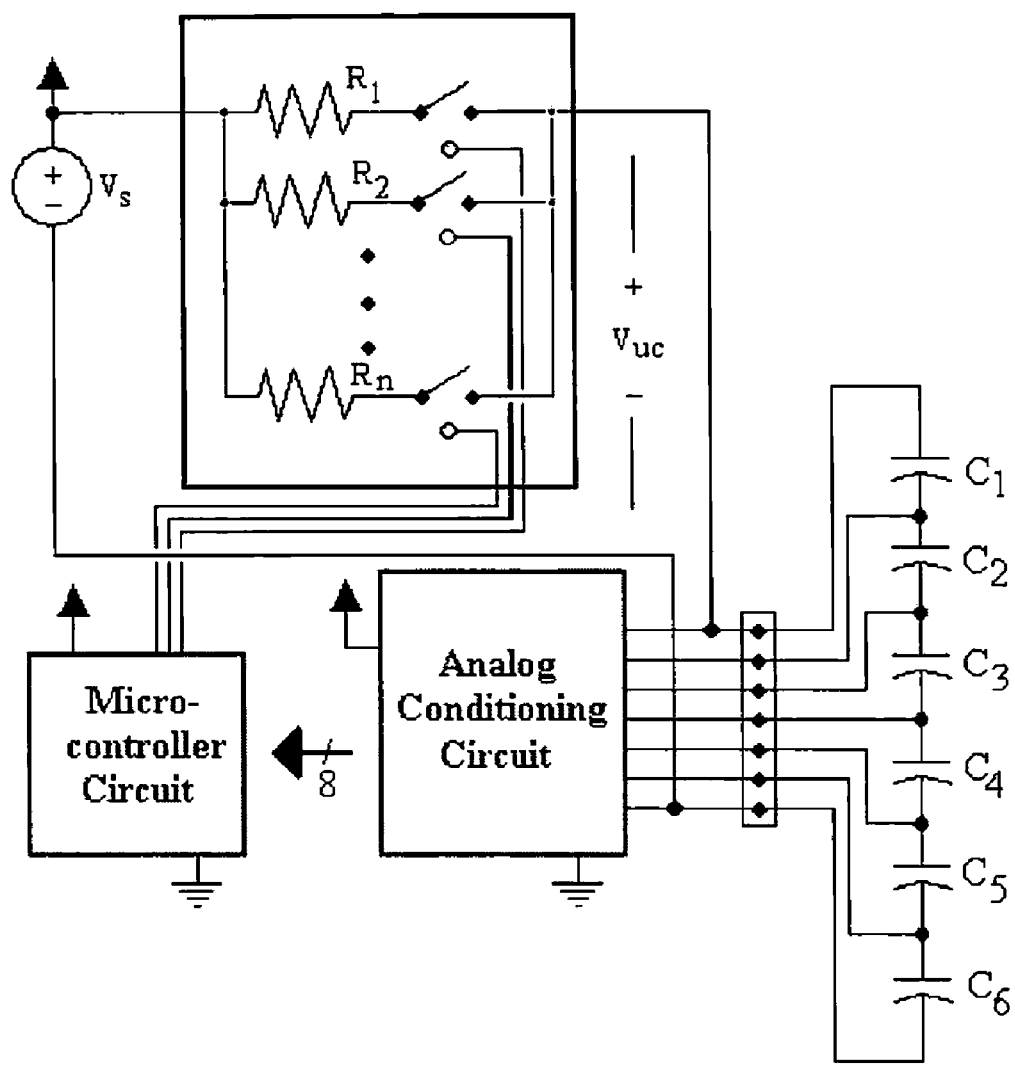
FIG. 4 is a schematic representation of one possible embodiment of the present invention with parallel resistors.
Figure 5:
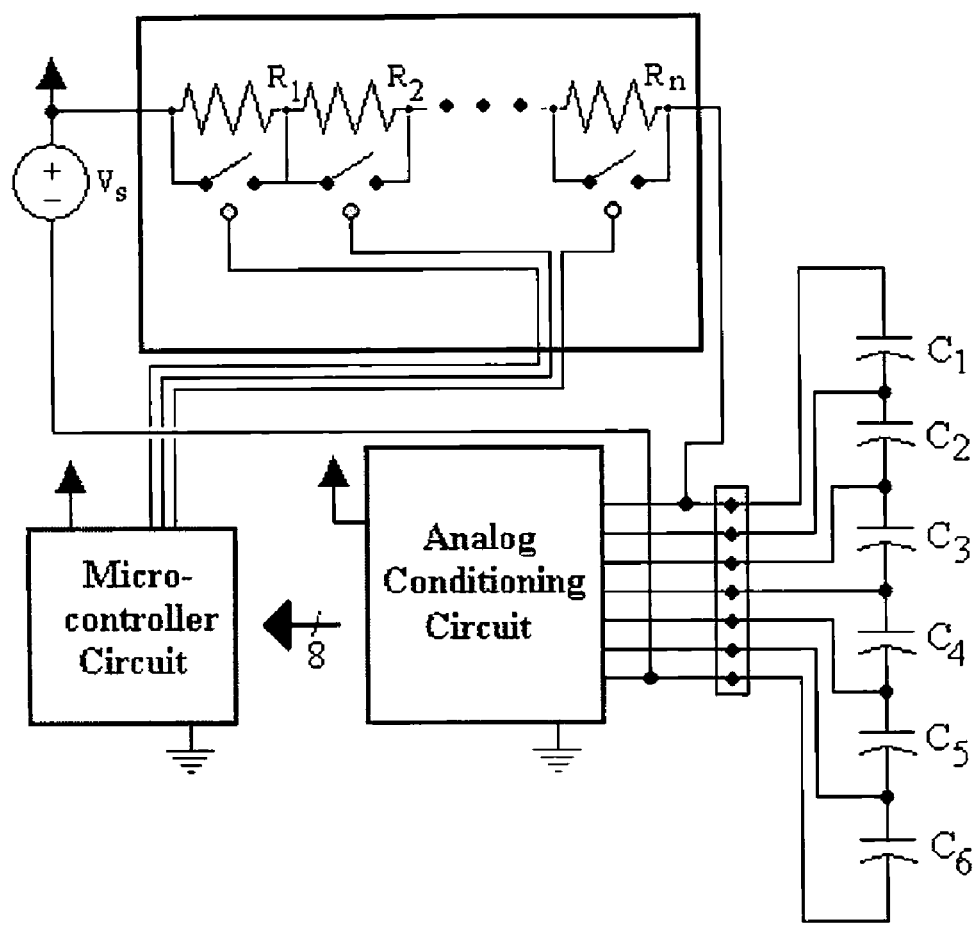
FIG. 5 is a schematic representation of one possible embodiment of the present invention with series resistors.

The resistive network consists of one or more resistors and one or more switches operated by the MCU. The resistive network is connected to the voltage source and (via MCU) is used to regulate the current that flows in the ultracapacitor cells. FIG. 4 shows one possible embodiment with parallel resistors and FIG. 5 shows one possible embodiment with series resistors. The MCU controls the switches, which modify the resistance between the DC source and the ultracapacitors. The amount of current flowing into the ultracapacitors is then (Equation 2):

$$I_{uc} = \frac{V_s - V_{uc}}{R_{network}} \quad (2)$$

Where: Vs is the source voltage, Vuc is the voltage over the ultracapacitors (total string voltage), and Rnetwork is the total resistance of the switched resistive network.

The current is regulated in steps by changing the resistance (Rnetwork) between the source (Vs) and the ultracapacitors. The higher number or switched resistors provides a higher resolution of resistance and therefore better control of current. As the voltage of the ultracapacitor string increases, the MCU reduces the resistance, Rnetwork. The MCU can calculate how much current will flow into the cells because the voltages of the ultracapacitors and source are measured, and the resistance, Rnetwork, is known based on different switch configurations.

The present invention's components can be integrated into one device, or could be spread among more than one device. For instance, the charger may be separate from the components including the ultracapacitors. As such, the ultracapacitor device would need to be connected to the charger to be charged, and disconnected from the charger when charging is complete. Alternatively, the charger could be built directly into the device containing the ultracapacitors. Further "connecting"/"disconnecting" is intended to include both physical connections as well as electrical connections (such as switches).

The following paragraphs describing three particular embodiments of the present invention. These embodiments are not exclusive.

The first embodiment is an ultracapacitor charging method for charging a string of ultracapacitor cells. The method comprising the steps of: (1) measuring the voltage of each ultracapacitor cell; (2) determining a maximum voltage level of each ultracapacitor cell; (3) determining which ultracapacitor cell has the largest voltage; (4) charging said string of ultracapacitor cells through use of a charger, said charger connected to a voltage source; (5) monitoring the voltage of the ultracapacitor cell having the largest voltage; and, (6) stopping the charging said string when the ultracapacitor cell with the largest voltage reaches its maximum voltage level.

It is preferred that the method further comprise: (1) first connecting said string of ultracapacitor cells to said charger, (2) last disconnecting said string of ultracapacitor cells from said charger. It is further preferred that the voltage of each ultracapacitor cell is monitored during the charging step to determine if one or more of the ultracapacitor cells has failed and if so alerting a user of said method of said failure. These ultracapacitors can be connected in series, parallel and/or a combination of series/parallel.

A second embodiment is a method of charging a string of ultracapacitors comprising the following steps: (1) connecting a string of ultracapacitors to a charger, said charger connected to a voltage source; (2) measuring the voltage of each of the ultracapacitors in said string; (3) charging said string of ultracapacitors using said charger; (4) monitoring the voltage of each ultracapacitor; (5) determining which ultracapacitor cell has the largest voltage; (6) monitoring the voltage of the ultracapacitor cell with the largest voltage during charging; (7) stopping charging of said string of ultracapacitors when the ultracapacitor cell with the largest voltage reaches its maximum voltage; and, (8) disconnecting said charger from said string of ultracapacitors. Further steps optionally including: (9) calculating the total string voltage by summing the voltages of said ultracapacitor cells, (10) following a current (charging) profile based upon the total string voltage; and (11) monitoring the voltage over each ultracapacitor cell during charging, monitoring the current passing through each ultracapacitor cell, and thereby determining if one or more of the ultracapacitor cells has failed.

A third embodiment being a charger for charging a string of ultracapacitors. The charger comprising: (1) a voltage source; (2) a MCU, said MCU measuring the voltage of each ultracapacitor cell via an analog circuit during charging to determine which ultracapacitor cell has the largest voltage, said MCU commanding current to said string of ultracapacitors based on the measured voltages, said MCU monitoring the voltage of the ultracapacitor cells and when the ultracapacitor cell with largest voltage reaches its maximum voltage the MCU commands the voltage source to stop charging the ultracapacitor string; and (3) a first analog circuit, said first analog circuit for allowing the MCU to measure the voltage of each ultracapacitor cell, said first analog circuit measuring the difference between the positive and negative terminals of each ultracapacitor in said string and outputting a signal proportional to the voltage to the MCU. Optionally the charger could comprise a second analog circuit regulating the current into the ultracapacitor cells that was commanded by the MCU. The voltage source could be a DC-DC converter.

In one version of this embodiment, the MCU monitors the voltage over each ultracapacitor cell and the current passing through each ultracapacitor cell to determine if one or more of the ultracapacitor cells has failed. In another version, the MCU calculates the total string voltages by summing the voltages of said ultracapacitor cells, and wherein based upon said total voltage said MCU allows the current from the power electronic converter to follow a charging profile based upon total output voltage. In yet another version, the MCU monitors the voltage over each ultracapacitor cell and the current passing through each ultracapacitor cell to determine if one or more of the ultracapacitor cells has failed, and wherein said MCU calculates the total string voltages by summing the voltages of said ultracapacitor cells, and wherein based upon said total voltage said MCU allows the current from the power electronic converter to follow a charging profile based upon total output voltage.

The exemplary embodiments shown in the figures and described above illustrate but do not limit the invention. It should be understood that there is no intention to limit the invention to the specific form disclosed; rather, the invention is to cover all modifications, alternative constructions, and equivalents falling within the spirit and scope of the invention as defined in the claims. For example, while the exemplary embodiments illustrate an ultracapacitor charger, the teachings of the invention is not limited to use with ultracapacitors and may be used with other power sources. While the invention is not limited to use with ultracapacitors, it is expected that various embodiments of the invention will be particularly useful in such devices. Hence, the foregoing description should not be construed to limit the scope of the invention, which is defined in the following claims.

While there is shown and described the present preferred embodiment of the invention, it is to be distinctly understood that this invention is not limited thereto, but may be variously embodied to practice within the scope of the following claims. From the foregoing description, it will be apparent that various changes may be made without departing from the spirit and scope of the invention as defined by the following claims.

The purpose of the Abstract is to enable the public, and especially the scientists, engineers, and practitioners in the art who are not familiar with patent or legal terms or phraseology, to determine quickly from a cursory inspection, the nature and essence of the technical disclosure of the application. The Abstract is neither intended to define the invention of the application, which is measured by the claims, nor is it intended to be limiting as to the scope of the invention in any way.

Still other features and advantages of the present invention will become readily apparent to those skilled in this art from the following detailed description describing preferred embodiments of the invention, simply by way of illustration of the best mode contemplated by carrying out my invention. As will be realized, the invention is capable of modification in various obvious respects all without departing from the invention. Accordingly, the drawings and description of the preferred embodiments are to be regarded as illustrative in nature, and not as restrictive in nature.

What is claimed is:

1. An ultracapacitor charging method for charging a string of ultracapacitor cells, said method comprising the steps of:
    measuring the voltage of each ultracapacitor cell;
    charging said string of ultracapacitor cells through use of a charger, said charger connected to a voltage source;
    calculating the total voltage of said string of ultracapacitor cells;
    following a current profile based upon the total voltage;
    determining the maximum voltage of each ultracapacitor cell;
    determining which ultracapacitor cell has the largest voltage;
    monitoring the voltage of the ultracapacitor cell having the largest voltage; and
    stopping the charging of said string when the ultracapacitor cell with the largest voltage reaches its maximum voltage level.

2. The method of claim 1, comprising the steps of first connecting said string of ultracapacitor cells to said charger, and last disconnecting said string of ultracapacitor cells from said charger.

3. The method of claim 1, wherein said voltage source is selected from the group consisting of at least one battery, a DC-DC converter, and a AC-DC converter.

4. The method of claim 1, comprising the steps of first connecting said string of ultracapacitor cells to said charger, and last disconnecting said string of ultracapacitor cells from said charger, and wherein said voltage source is selected from the group consisting of at least one battery, a DC-DC converter, and a AC-DC converter.

5. The method of claim 1 wherein the voltage of each ultracapacitor cell is monitored during the charging step to determine if one or more of the ultracapacitor cells has failed and if so stopping said charging and alerting a user of said method of said failure.

6. The method of claim 1, wherein said ultracapacitors are connected in series.

7. The method of claim 1, wherein said ultracapacitors are connected in a combination of series and parallel.

8. The method of claim 1, wherein said ultracapacitors are connected in parallel.

9. A charger for charging a string of ultracapacitors, said charger comprising:
    a power electronic converter, said power electronic converter connected to a voltage source, said power electronic converter for regulating the current that flows in said string of ultracapacitors;
    a microcontroller/microprocessor (MCU), said MCU for commanding the current that flows from said power electronic converter to said string of ultracapacitors;
    a first analog circuit, said first analog circuit for measuring said ultracapacitor cell voltage; and
    a second analog circuit, said second analog circuit for performing closed loop current control.

10. The charger of claim 9, wherein said voltage source is selected from the group consisting of at least one battery, a DC-DC converter and an AC-DC converter.

11. The charger of claim 9, wherein said MCU monitors the voltage over each ultracapacitor cell and the current passing through each ultracapacitor cell to determine if one or more of the ultracapacitor cells has failed.

12. The charger of claim 9, wherein said MCU calculates the total string voltages by summing the voltages of said ultracapacitor cells, and wherein based upon said total voltage said MCU allows the current from the power electronic converter to follow a current profile.

13. The charger of claim 12, wherein the current profile is based upon the total output voltage and the individual cell voltages.

14. The charger of claim 9, wherein said MCU monitors the voltage over each ultracapacitor cell and the current passing through each ultracapacitor cell to determine if one or more of the ultracapacitor cells has failed, and wherein said MCU calculates the total string voltages by summing the voltages of said ultracapacitor cells, and wherein based upon said total voltage said MCU allows the current from the power electronic converter to follow a current profile.

15. A charger for charging a string of ultracapacitors, said charger comprising:
    a voltage source;
    a resistive network, said resistive network comprising controllable switches and resistors, said resistive network connected to said voltage source, said resistive network regulates the current that flows in the ultracapacitors;
    an analog circuit allowing the voltage of each ultracapacitor cell to be measured; and
    a microcontroller/microprocessor (MCU), where said MCU measures the voltage of each ultracapacitor cell, where said MCU commands the current that flows from said resistive network to said ultracapacitors, said MCU controls the switches in the resistive network by turning them on or off, said MCU determining which ultracapacitor cell has the largest voltage.

16. The charger of claim 15, wherein said resistive network is a series network, or a parallel network, or a combination of a series and parallel network.

17. The charger of claim 15, wherein when the ultracapacitor cell with the largest voltage reaches its maximum voltage, the MCU turns the switches in the resistive network off, thereby stopping the charging of said ultracapacitor string.

18. The charger of claim 15, wherein said MCU monitors the voltage over each ultracapacitor cell and the current passing through each ultracapacitor cell to determine if one or more of the ultracapacitor cells has failed.

19. The charger of claim 15, wherein said MCU calculates the total string voltages by summing the voltages of said ultracapacitor cells, and wherein based upon said total voltage said MCU allows the current from the voltage source to follow a current profile.

20. The charger of claim 15, wherein said voltage source is selected from the group consisting of at least one battery, a DC-DC converter and an AC-DC converter.

* * * * *